United States Patent [19]
Josephs

[11] Patent Number: 5,459,404
[45] Date of Patent: Oct. 17, 1995

[54] APPARATUS AND METHOD FOR DETECTING FLOATING NODES

[75] Inventor: David S. Josephs, Tempe, Ariz.

[73] Assignee: ULSI Technology, Inc., San Jose, Calif.

[21] Appl. No.: 219,682

[22] Filed: Mar. 28, 1994

[51] Int. Cl.⁶ .................................................... G01R 33/00
[52] U.S. Cl. ........................ 324/751; 324/752; 324/158.1; 324/758; 324/753; 324/501; 356/400
[58] Field of Search .................................. 324/751, 752, 324/158.1, 758, 753, 501; 356/400

[56] References Cited

U.S. PATENT DOCUMENTS

| | | | |
|---|---|---|---|
| 3,867,697 | 2/1975 | Vanzetti et al. | 324/752 |
| 4,287,473 | 9/1981 | Sawyer | 324/752 |
| 4,999,577 | 3/1991 | Beha | 324/752 |
| 5,017,863 | 5/1991 | Mellitz | 324/751 |
| 5,053,699 | 10/1991 | Aton | 324/752 |

Primary Examiner—Kenneth A. Wieder
Assistant Examiner—Kourosh Cyrus Khosravi
Attorney, Agent, or Firm—Lavalle D. Ptak

[57] ABSTRACT

An apparatus and method for locating light sensitive circuit design flaws on an integrated circuit chip comprises placing the integrated circuit chip on a load board, which is coupled electrically with a tester to supply operating power to the chip device. The current used by the chip device is continuously measured. A stereoscopic microscope is used to direct a spot of light through one of the eyepieces of the microscope onto the upper surface of the chip; and the spot of light is moved along a predetermined path to scan the surface of the chip. Through the other eyepiece of the microscope, the location of the spot of light is observed. When the measured current drain undergoes changes, as the spot of light impinges on the chip, the location is noted. The quadrant or other area of the chip, in which the change of current consumption occurred as a result of the spot of light, then is scanned a second time with a smaller spot of light; and the process is repeated. This is done as many times as possible to pinpoint a limited area of the chip which may contain the defect.

5 Claims, 1 Drawing Sheet

APPARATUS AND METHOD FOR DETECTING FLOATING NODES

BACKGROUND

In the manufacture of very large scale integrated circuit chips, the manufacturing steps include the initial step of creating a detailed circuit diagram of the system which is to be manufactured on the integrated circuit chip. After the circuit diagram has been designed, different photographic masks are prepared for the implementation of the circuit diagram into physical form on the chip. Different steps in the manufacturing process use these masks for effecting the doping of the silicon crystal forming the chip. The die size of a typical chip, including many thousands of components, is one-half inch by one half inch. Because of the large number of components, it is possible for errors to be made, either in the original circuit design or in the various masks which are employed to incorporate that circuit onto the chip through the manufacturing process.

To ensure that the manufactured chip performs in accordance with the original intended design, test operations of the chip typically are undertaken prior to the sale of the chip to customer. Even so, an occasional problem exists, in which chips tend to draw excess current when they are installed into an end-use system. Excessive current draw can be a significant problem for chips which are used in portable computers and the like, since the excessive current draw depletes the useful battery life of such portable devices sooner than intended. More generally, excessive current draw is often viewed as a potential reliability problem. One type of flaw which causes excessive current draw is the existence of one or more "floating nodes" on a chip when these nodes are created by design flaws in the original circuit design and/or in the manufacturing processes as a result of a flaw in one or more of the masks used during the manufacturing process. During operating tests of such chips, such "floating nodes" often are undetected, since the chips generally perform as designed, with the exception of the excessive current draw.

It has been discovered that "floating node" design flaws on a chip are often light sensitive (that is, the excessive current draw disappears in the presence or absence of light). Since integrated circuit chips typically are potted or shielded from light in their final packages, the floating node excessive current draw takes place. Even should the current draw not be inversely sensitive to light (that is, the excessive current draw disappears in the absence of light), the unstable nature of a floating node makes the future behavior of the activation unpredictable.

Accordingly, it is desirable to provide a method and apparatus for locating floating node circuit design flaws in an effective manner to pinpoint the specific areas of the chip having such floating nodes.

SUMMARY OF THE INVENTION

It is an object of this invention to provide an improved method and apparatus for locating circuit design flaws on an integrated circuit chip.

It is an additional object of this invention to provide an improved method for locating light sensitive design flaws on an integrated circuit chip.

It is another object of this invention to provide an apparatus for use in locating light sensitive design flaws on an integrated circuit chip.

It is a further object of this invention to provide a method and apparatus for pinpointing the area of floating node design flaws on an integrated circuit chip.

In accordance with a preferred embodiment of this invention, an apparatus and method has been developed for locating light sensitive circuit design flaws on an integrated circuit chip. The apparatus comprises a device for directing a spot of light, having an area which is less than the surface area of an integrated circuit chip, along a predetermined path scanning the surface of the chip. Simultaneously, the chip is stimulated; and a measurement of current supplied to the chip is made. Observation of the location of the spot of light on the surface of the chip is made simultaneously with observation of the current drawn by the chip, to detect changes in the current drain as the spot of light impinges on the chip.

In employing the method, once an initial scan of the chip locates one or more areas of the chip where the current drain changes, the spot of light is reduced in size; and the region of the chip causing the initial current drain change is scanned along a pre-established path on the surface of the chip, once again observing the location where current drain changes take place. If a further narrowing of the area on which the current drain changes take place is desired, the process is repeated with a still smaller spot of light in order to narrow down the area of chip where the circuit design flaw exists. This is done to permit subsequent examination of the actual circuit diagram for that area, along with an investigation of the various masks used to construct the circuit on the chip, to determine where the design flaws exist.

DETAILED DESCRIPTION

Figure 1:
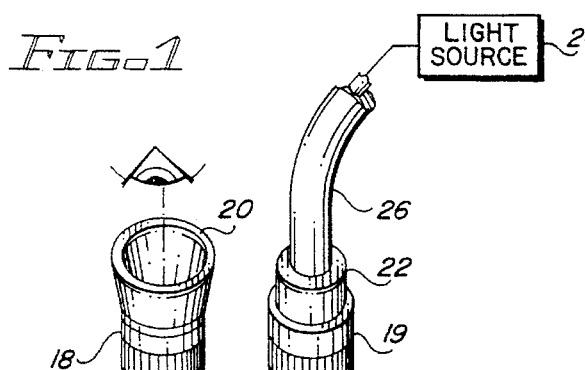
FIG. 1 is a diagrammatic representation (not to scale) of an apparatus used in accordance with a preferred embodiment of the invention.

Reference now should be made to the drawing, in which the same reference numbers are used throughout the different figures to designate the same or similar components. FIG. 1 shows a stereoscopic microscope 17, which has been modified in order to practice the method of a preferred embodiment of the invention. The microscope 17 is a conventional microscope, having two oculars 18 and 19. The ocular 18 is fitted with a conventional eyepiece 20 for viewing by the eye of a user of the microscope to observe an integrated circuit chip 10 placed on, and electrically interconnected with, a test system load board 11. The load board 11, in turn, is electrically interconnected with an integrated circuit chip ester 14. The load board 11 and the integrated circuit chip tester 14 are of conventional types utilized in the integrated industry for supplying power to integrated circuit chips 10 and for performing various tests on the input/output I/O) leads of a chip 10 placed on the load board 11.

Typically, the integrated circuit chip 10 has a die size of approximately one-half inch by one-half inch, and includes many thousands of electrical components. In the operation of the device of FIG. 1, the chip 10 typically is a silicon chip;

and the test forming the subject matter of the preferred embodiment of this invention is performed on a chip which has been packaged such that the entire die surface area is exposed. Contacts are made between the chip 10 and corresponding contacts on the load board 11 in a conventional manner, leaving the top surface of the chip 10 exposed.

A chip tester 14 is used for measuring the overall current draw of the chip 10. A test start is made after each movement of a scanned light spot. The light does not move until the test is complete and measurement taken. This technique is used to provide a continuous indication of the current being drawn or consumed by the chip 10. This constitutes the operating current for the chip 10. The device of FIG. 1 is used for the purpose of detecting floating node errors in the design of the chip 10 when consistent excess current draw of chips 10 of a particular design have been encountered after the chips 10 have been incorporated into integrated circuit packages for subsequent use in various systems.

It has been discovered that floating node design flaws on a chip 10 are often light sensitive, that is, the excessive current draw disappears in the presence or absence of light. Consequently, the device of FIG. 1 has the second ocular 19 of the stereoscopic microscope 17 fitted with a termination plug 22 for a fiber-optic light tube 26 used to supply light from a source 24 through the ocular 19 of the microscope 17 and through the internal optics of the microscope by way of a light path 30, illustrated in FIG. 1, to the upper or exposed surface of the chip 10. For situations where the design flaw of a chip is not light sensitive, a conventional liquid crystal analysis may be employed. For light sensitive design flaws, however, liquid crystal analysis is precluded. Even if liquid crystal is an option, the technique relies heavily on an extremely controlled ambient temperature, which is difficult to achieve in a test floor environment.

Figure 2:
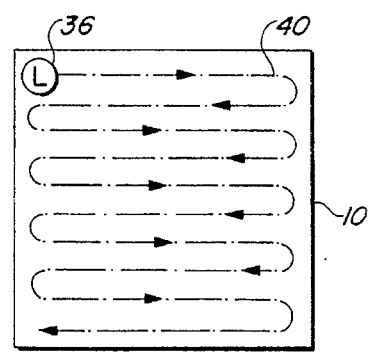
FIG. 2 is a diagrammatic representation of the method of use of the apparatus of FIG. 1.

In using the device of FIG. 1, the light source 24 is turned on; and the ambient or surrounding light is removed (that is, the device is used in a darkened room or in a darkened box). The spot of light 36 from the light source 24 then is focused to a first size or diameter, which has an area which is substantially less than the area of the surface of the chip 10. The light beam or spot of light 36 from the beam 30 is scanned over the surface of the chip in a winding path 40, as illustrated in FIG. 2; so that the spot of light 36 impinges on all areas of the chip throughout the scan. The scan may be effected automatically by causing a relative movement between the spot 36 and the surface of the chip 10; or it may be effected manually under control of the knobs 32 and 33 on the microscope, which are used to effect relative X-Y adjustments of stereoscopic microscopes With respect to a specimen (here, the chip 10) placed at the focal point of the microscope.

During the scan of the spot of light 36 along the path 40 shown in FIG. 2, test starts are sent to the chip tester 14 and current measurements are made. The measurements are observed to determine where, if any, changes in the current drawn by the chip 10 occur. Once these changes in the current draw indicated by the tester 14 (at the indicator 15) take place, visual observation of the location on the surface of the chip 10 is effected through the eyepiece 20 to locate the specific quadrants in which the current changes take place.

Figure 3A:
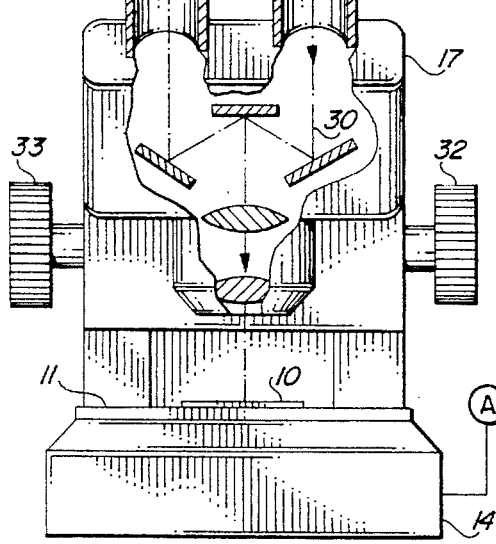
FIGS. 3A through 3E are diagrams useful in explaining the method of operation of the apparatus of FIG. 1 in accordance with the representation of FIG. 2.

FIG. 3A is representative of the first or gross scan of the chip 10 to determine which quadrants, A, B, C or D of the chip 10, include a light sensitive floating node error. For illustrative purposes, assume an error that is typified by an inverse relationship to light, that is the excessive current draw drops in the presence of light; so that for regions of the chip which do not include a floating node design error, the current draw remains high even though the spot of light 36 is impinging on the upper surface of the chip 10. When a quadrant or region of the chip 10, however, which has a floating node error in it, is illuminated by the spot of light 36, the current draw for the entire chip drops as a result of the light impinging on the chip. In FIG. 3A, this is indicated by the circled illustrations showing high current draw for quadrants A, C and D and a low current draw for the quadrant B of the chip 10, indicative of a floating node error somewhere in quadrant B of the chip 10.

For the purposes of illustration in FIGS. 3A through 3D, the current levels are indicated as "spikes". It should be noted, however, that the current levels encountered, particularly for quadrants A, C and D, are a steady state, relatively high or undesirable current level, and that when the light spot 36 impinges upon the floating node error portion of the chip, the current level drops to a lower steady state current so long as the light spot is on the defective region. For purposes of illustration, however, the effect is considered to be better illustrated by showing "spikes" of current in the circled portions, since it is a relative current difference which is detected on the tester 14 for isolating the different quadrants of the chip 10 which may contain a floating node error in them.

Once the scan of FIG. 3A has taken place, and it is determined that only the quadrant B of the chip 10 has a potential floating node error in it, the procedure is repeated for the quadrant B only. When this is done, the size of the spot 36 is reduced by affecting the zoom of the microscope to create a smaller spot of light from the light source 24. The process is repeated for the four subquadrants B1 through B4 of quadrant B, shown in FIG. 3A. This subdivision of quadrant B, with the same scan pattern taking place as shown in FIG. 2, is illustrated in FIG. 3B. As shown in FIG. 3B, it is determined that subquadrants B1, B3 and B4 are correct or normal, but that a floating node error occurs in subquadrant B2. Once again, further isolation of subquadrant B2 is effected; and a scanning of that subquadrant is effected by employing the method described above. The spot of light 36 is focused to an even smaller spot of light; and the process is repeated. As illustrated in FIG. 3C, a determination is made that the floating node error occurs in the sub-subquadrant B2-1 of the four sub-subquadrants B2-1 through B2-4.

Figure 3D:
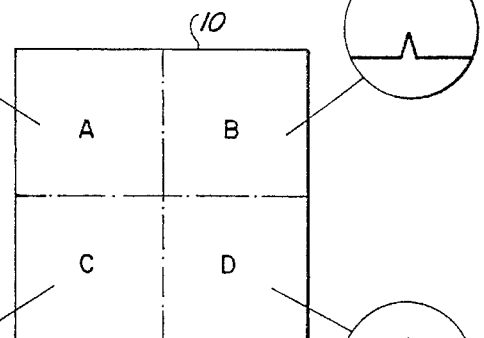
Figure 3B:
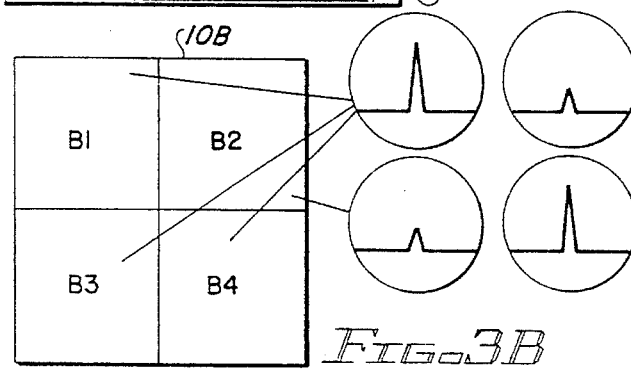
Figure 3C:
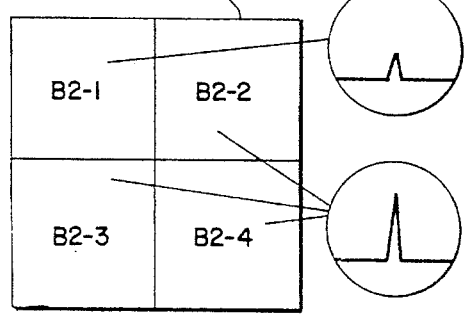

If possible, given the die area, the process may be repeated one more time, as illustrated in FIG. 3D, breaking the sub-subquadrant B2-1 into four sub-sub-subquadrants B2-1A through B2-1D. As illustrated in FIG. 3D, the floating node error is isolated into the sub-sub-subquadrant B2-1A, which significantly limits the area of the original chip circuit and mask set which must be re-examined in order to determine the location of the design flaw creating the floating node on the chip 10.

Figure 3E:
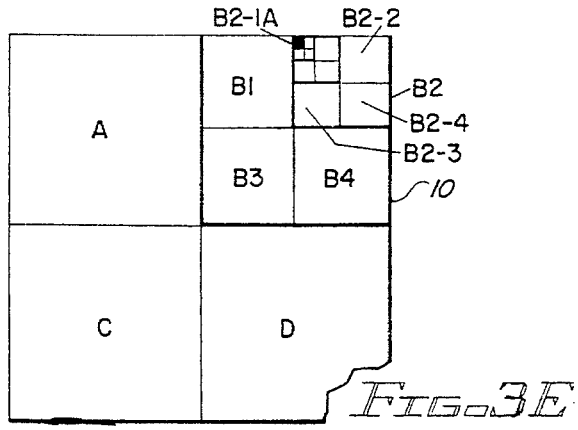

FIG. 3E illustrates the final breakdown, which is effected by means of the steps shown through FIGS. 3A through 3D, pinpointing the location of the floating node in the sub-subsubquadrant B2-1A. It is apparent from an examination of FIG. 3E that the percentage of the area of the chip 10 which must be examined in the circuit diagrams and mask sets to determine the cause of the floating node error is pinpointed to a relatively small portion of the total surface area of the chip 10. This greatly expedites the redesign steps necessary to locate and correct the design error. If the entire circuit design and mask set areas for the chip 10 needed to be examined to locate the design area of sub-sub-subquadrant B2-1A, a considerable additional expense of time and effort beyond that required for just the examination of the small area B2-1A would occur. As a consequence, the method which is employed in the preferred embodiment of this invention significantly reduces the time and effort required to locate and then correct floating node system design errors on a chip.

The foregoing description of the preferred embodiment of the invention is to be considered as illustrative and not as limiting. The technique which is used to simultaneously observe the location of the spot of light and to scan the spot of light over the surface of the chip 10 may be varied to perform substantially the same function, in substantially the same way, to achieve substantially the same result, without departing from the true scope of the invention as defined in the appended claims.

I claim:

1. A method for locating circuit design flaws on an integrated circuit chip including the steps of:

placing an integrated circuit chip having an upper surface on a load board for supplying operating power to said integrated circuit chip;

measuring the current drain of said chip;

scanning the surface of, said chip along a predetermined path with a first spot of light which has an area less than the area of said chip;

observing the location of said first spot of light and said measured current drain to identify a quadrant on the surface of said chip where the current drain changes;

scanning the surface of said chip in said identified quadrant with a second smaller spot of light than said first spot of light; and observing the location of said second smaller spot of light and the measured current drain to determine the portion of said identified quadrant of said chip where said current drain changes as said second smaller spot of light impinges on said identified quadrant of said chip.

2. The method according to claim 1 wherein the step of measuring said current drain of said chip measures said current drain after each movement of said first and second spots of light.

3. The method according to claim 1 further including the step of determining a sub-quadrant of said identified quadrant of the surface of said chip where current drain changes; reducing the diameter of said second spot of light to a third lesser diameter spot of light than said second smaller spot of light and repeating the steps of scanning the surface of said chip in said sub-quadrant to more specifically determine the area of said chip where current drain changes as said third lesser diameter spot of light impinges on said sub-quadrant of said chip.

4. The method according to claim 3 wherein said spots of light are focused on said chip through a first eyepiece of a stereoscopic microscope and the step of observing the location of said spots of light is effected through a second eyepiece of said stereoscopic microscope.

5. The method according to claim 1 wherein said spots of light are focused on said chip through a first eyepiece of a stereoscopic microscope and the step of observing the location of said spots of light is effected through a second eyepiece of said stereoscopic microscope.

* * * * *

UNITED STATES PATENT AND TRADEMARK OFFICE
CERTIFICATE OF CORRECTION

PATENT NO. : 5,459,404
DATED : Oct. 17, 1995
INVENTOR(S) : Josephs, David S.

It is certified that error appears in the above-indentified patent and that said Letters Patent is hereby corrected as shown below:

Assignee: VLSI Technology, Inc., San Jose, Calif.

Signed and Sealed this

Twenty-third Day of January, 1996

Attest:

BRUCE LEHMAN

*Attesting Officer*     *Commissioner of Patents and Trademarks*